United States Patent
Takaki

(10) Patent No.: US 7,582,194 B2
(45) Date of Patent: Sep. 1, 2009

(54) METHOD AND APPARATUS FOR FORMING FLUORIDE THIN FILM

(75) Inventor: Satoshi Takaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 667 days.

(21) Appl. No.: 10/900,170

(22) Filed: Jul. 28, 2004

(65) Prior Publication Data
US 2005/0023131 A1 Feb. 3, 2005

(30) Foreign Application Priority Data
Aug. 1, 2003 (JP) .............................. 2003-284692

(51) Int. Cl.
C23C 14/00 (2006.01)
C23C 14/32 (2006.01)
C25B 11/00 (2006.01)
C25B 13/00 (2006.01)

(52) U.S. Cl. .............................. 204/192.15; 204/192.1; 204/298.01; 204/298.07

(58) Field of Classification Search ............ 204/192.12; 360/126; 438/533, 612, 787
See application file for complete search history.

(56) References Cited

U.S. PATENT DOCUMENTS

| | | | | |
|---|---|---|---|---|
| 3,477,936 | A * | 11/1969 | Gillery et al. ........... | 204/192.29 |
| 4,485,389 | A * | 11/1984 | Ovshinsky et al. ............ | 257/56 |
| 5,628,882 | A * | 5/1997 | O'Keefe et al. ........ | 204/192.15 |
| 6,103,320 | A * | 8/2000 | Matsumoto et al. ......... | 427/535 |
| 6,121,162 | A * | 9/2000 | Endo .......................... | 438/787 |
| 6,214,717 | B1 * | 4/2001 | Lan et al. .................... | 438/612 |
| 6,217,719 | B1 * | 4/2001 | Kanazawa et al. ..... | 204/192.12 |
| 6,315,873 | B1 * | 11/2001 | Lowe et al. ............ | 204/192.15 |
| 6,458,253 | B2 * | 10/2002 | Ando et al. ............ | 204/192.15 |
| 6,806,172 | B1 * | 10/2004 | Woo et al. ................... | 438/533 |
| 2003/0072105 | A1 * | 4/2003 | Ueda et al. .................. | 360/126 |

FOREIGN PATENT DOCUMENTS

| | | |
|---|---|---|
| JP | 4-289165 | 10/1992 |
| JP | 7-166344 | 6/1995 |

OTHER PUBLICATIONS

CRC Handbook of Chemistry & Physics, 87th ed. CRC Press, 2006. p. 10-209.*
http://www.webelements.com/webelements/elements/text/Ar/bind.html [Accessed on Feb. 19, 2008].*
W. L. Morgan, "A Critical Evaluation of Low-Energy Electron Impact Cross Sections for Plasma Processing Modeling. I: $CI_2$, $F_2$, and HCI", *Plasma Chem. & Plasma Proc.*, vol. 12, No. 4, 1992, pp. 449-476.

* cited by examiner

*Primary Examiner*—Alexa D Neckel
*Assistant Examiner*—Michael Band
(74) *Attorney, Agent, or Firm*—Fitzpatrick, Cella, Harper & Scinto

(57) ABSTRACT

There are provided a method and an apparatus for forming a fluoride thin film having a desired refractive index and no absorption throughout a range including the ultraviolet region and the visible region, using a sputtering method. The method of forming a fluoride thin film according to the present invention is a method of forming a metal fluoride thin film on a substrate by performing reactive sputtering with a gas comprising fluorine by use of a metal target, which comprises irradiating a gas comprising fluorine with electrons having an energy less than the ionization energy of the gas comprising fluorine to activate the gas and introducing the activated gas into a reaction apace, thereby performing sputtering.

8 Claims, 4 Drawing Sheets

METHOD AND APPARATUS FOR FORMING FLUORIDE THIN FILM

This application claims priority from Japanese Patent Application No. 2003-284692 filed on Aug. 1, 2003, which is hereby incorporated by reference herein.

BACKGROUND OF THE INVENTION

1. Field of the Invention

The present invention relates to an optical thin film, such as an antireflective film and a dielectric multilayer mirror, used in optical components for visible and ultraviolet regions, and a method for manufacturing the same.

2. Related Background Art

Heretofore, when an optical thin film such as an antireflective film or a mirror is formed, a vacuum vapor deposition method has been mainly used in which a film-forming material is heated by means of an electron beam or the like in a vacuum to be deposited on a substrate. In general, the antireflective film, mirror or the like is composed of either one of a material having a low refractive index such as magnesium fluoride ($MgF_2$), and a material having a high refractive index such as zirconium oxide ($ZrO_2$), tantalum oxide ($Ta_2O_5$) and titanium oxide ($TiO_2$), or a multilayer film formed by combining these materials with each other, and the layer constitution, film thickness or the like is adjusted in various ways depending on required optical performance.

Although the vapor deposition method is a film-forming method that can form films rapidly on a large-area substrate using a simple-structure apparatus and is excellent in productivity, the method has posed the problems that highly accurate control of the film thickness and development of an automatic production machine are difficult, and that if a film is formed in a state of a low substrate temperature, the obtained film will have an insufficient strength and is liable to be scratched, and that the adhesion between the film and the substrate is poor.

In recent years, since a higher efficiency of production has been demanded, there has been increased for these optical thin films a need for coating using a sputtering method, which is advantageous in labor saving, stabilization of quality, and improvement in film quality (adhesion and film strength).

By using the sputtering method for formation of an oxide dielectric thin film such as of zirconium oxide ($ZrO_2$), tantalum oxide ($Ta_2O_5$), titanium oxide ($TiO_2$) and aluminum oxide ($Al_2O_3$), thin films of a low absorption and a high refractive index can easily be formed. However, fluorides such as $MgF_2$ and $AlF_3$, which are important materials for thin films having such a low refractive index as 1.45 or less and having a large influence on the optical performance of multilayer optical thin films, have a problem that low-absorption thin films cannot easily be formed.

As a method for forming the fluoride thin film using a sputtering method, for example, the method disclosed in Japanese Patent Application Laid-Open No. H04-289165 has been known. This is a method in which a film of an alkaline-earth metal fluoride such as $MgF_2$ is formed by sputtering using a mixed gas of an inert gas such as Ar and a fluorine-based gas such as $CF_4$.

Also, as shown in Japanese Patent Application Laid-Open No. H07-166344, there has been known a method in which DC sputtering is performed using a metal target and a mixed gas of an inert gas such as Ar and a fluorine-based gas such as $CF_4$.

However, when a film of $MgF_2$ used as the most typical material having a low refractive index is formed using a sputtering method, F is dissociated during sputtering, so that the composition of the film deviates out of the stoichiometric composition to form an Mg-rich film, whereby the film will cause absorption in the ultraviolet and visible regions.

In order to solve this problem, Japanese Patent Application Laid-Open No. H04-289165 discloses a sputtering method using a fluorine-based gas to complement F.

Further, according to Japanese Patent Application Laid-Open No. H07-166344, DC sputtering using a metal target enables substrate sheath voltage to be lowered, and cation damage to de reduced.

However, even if a fluorine-based gas is introduced to complement fluorine atoms, as compared with the quantity of metal atoms that are sputtered from the target and impinge on the substrate, active fluorine atoms formed by dissociation in a plasma in the vicinity of the target and fluorine-containing gas molecules are consumed to fluorinate the target and the metallic atoms deposited on a portion other than the substrate in the vicinity of the target and only a small quantity thereof reaches the surface of the substrate, resulting in shortage of fluorine in the film on the substrate. This tendency becomes remarkable when the sputtering rate is high.

Moreover, if sputtering is performed in a state in which fluorine is adsorbed to the surface of the target, and the surface of the target is fluorinated, there are posed the problems of occurrence of abnormal discharge or significant dust generation.

Therefore, when the above-mentioned sputtering method is used, since the quantity of fluorine atoms that impinge on the substrate is insufficient, and the bonding state is disturbed, only $MgF_2$ thin films with a large absorption can be formed. Similarly, only thin films having insufficient quantities of fluorine can be formed for metal fluorides such as $AlF_3$, LiF and $LaF_3$.

SUMMARY OF THE INVENTION

In consideration of the above-described situations, the object of the present invention is to provide a method and an apparatus for forming a fluoride thin film having a desired refractive index without absorption throughout a region ranging from the ultraviolet region to the visible region.

According to a first aspect of the present invention, there is provided a thin film forming method of forming a metal fluoride thin film on a substrate by performing reactive sputtering with a gas comprising fluorine by use of a metal target, which comprises irradiating a gas comprising fluorine with electrons having an energy less than the ionization energy of the gas comprising fluorine to activate the gas and introducing the activated gas into a reaction apace, thereby performing sputtering.

In the present invention, it is preferred that the electrons used for the irradiation are thermal electrons emitted from a filament.

Further, it is preferred that the filament is heated by applying a voltage such that the energy given by the applied voltage is less than the ionization energy of the gas.

Moreover, it is preferred that the thermal electrons emitted from the filament are accelerated such that the energy given by the sum of the voltage applied for heating the filament and the voltage applied for accelerating the thermal electrons emitted from the filament is less than the ionization energy of the gas.

Further, it is preferred that the gas comprising fluorine is either fluorine gas or $SF_6$ gas.

Moreover, it is preferred that a rare gas as a sputtering gas is introduced into the vicinity of the metal target while the gas comprising fluorine is activated and introduced into the vicinity of the substrate.

According to a second aspect of the present invention, there is provided a thin film forming apparatus for forming a metal fluoride thin film on a substrate by performing reactive sputtering with a gas comprising fluorine by use of a metal target, which comprises an electron source for irradiating a gas comprising fluorine with electrons having an energy less than the ionization energy of the gas comprising fluorine.

In the present invention, it is preferred that the electron source is a filament for emitting thermal electrons.

Further, it is preferred that the thin film forming apparatus further comprises a first gas supply means for introducing a sputtering gas into the vicinity of the metal target and a second gas supply means for activating the gas comprising fluorine and introducing the activated gas into the vicinity of the substrate.

DESCRIPTION OF THE PREFERRED EMBODIMENTS

Figure 1:
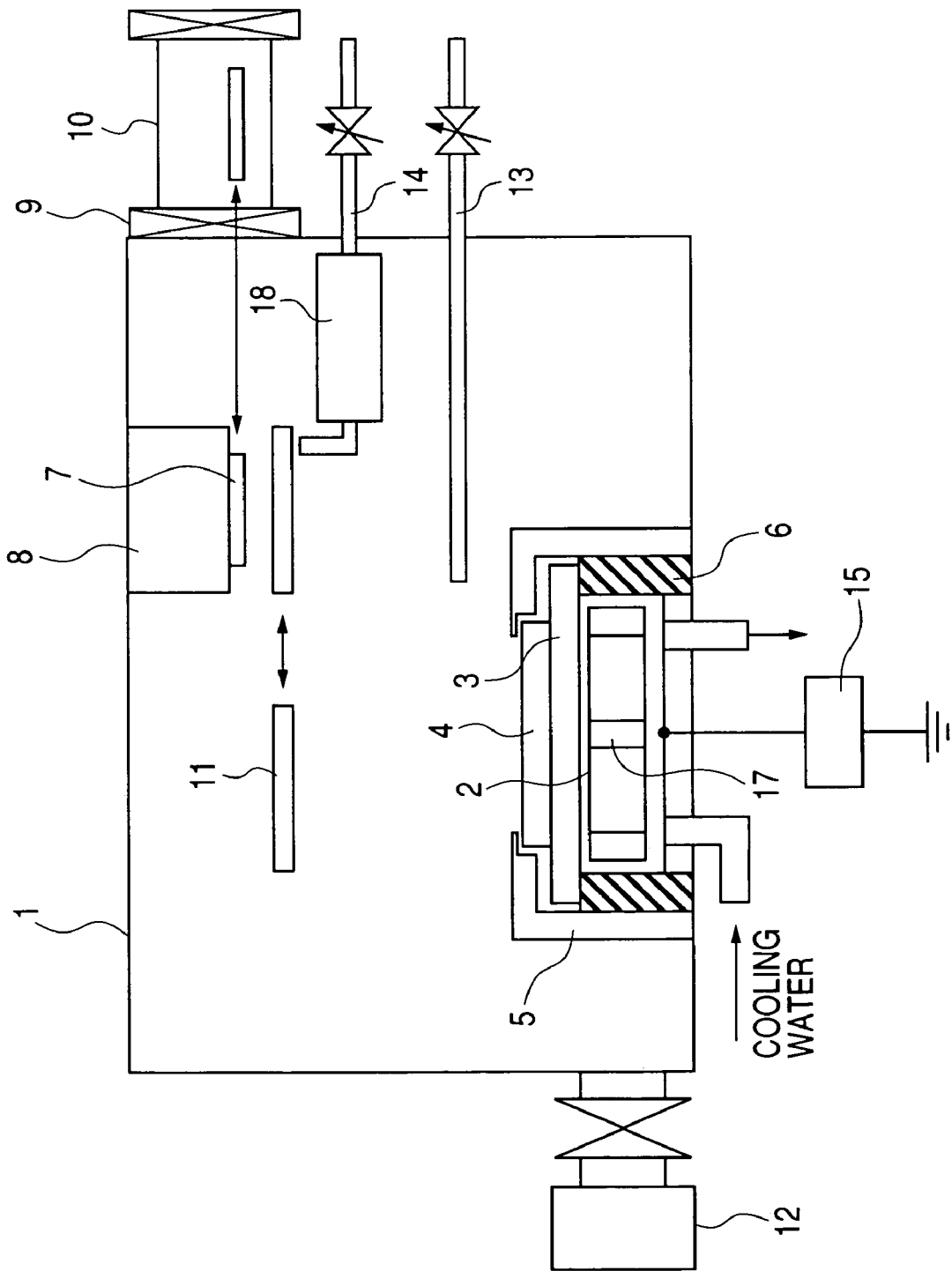
FIG. 1 is a sectional view showing an apparatus for forming a fluoride thin film according to the present invention.

In the method of forming a fluoride thin film of the present invention, when performing sputtering wherein ions formed during discharge are made to collide against a metal target in a vacuum vessel into which a gas containing at least fluorine is introduced, and particles sputtered from the target are deposited on an article to be processed (hereinafter, sometimes simply referred to as "article") such as a substrate to form a film, the sputtering is performed while supplying active fluorine atoms into the vicinity of the substrate such that the quantity of active fluorine atoms that reach the surface of the substrate can be increased to form a stoichiometric metal fluoride.

As a means for supplying active fluorine atoms, there has generally been known a method of decomposing a fluorine-containing gas using plasma. However, in a fluoride film such as an $MgF_2$ film, optical absorption may occur due to a defect known as a color center formed by plasma damage, or due to shortage of fluorine caused by implantation of ions from plasma to emit fluorine. In order to prevent this optical absorption, a measure to keep plasma away from the substrate is adopted. However, such a measure will make the substrate distant from the source of active fluorine atoms, so that the supply of the active fluorine becomes insufficient.

In the present invention, as a means for supplying active fluorine atoms not resulting from plasma into the vicinity of the substrate, electrons having an energy less than the ionization energy of a fluorine-containing gas are irradiated to the fluorine-containing gas to cause a dissociation reaction or a dissociative electron attachment reaction without generating plasma, thereby activating and introducing the fluorine-containing gas.

The dissociation reaction and the dissociative electron attachment reaction will be described below. Although various collision processes of an electron against an atom or a molecule of a gas have been known, typical ones will be shown below. Elastic collision: The kinetic energy is conserved, and only the direction is changed by the collision.

$$e+A \rightarrow e+A \qquad \text{Equation (1)}$$

Ionization: The collision of an electron e against a gas A emits an electron out of the gas A, and the gas A is converted to an ion.

$$e+A \rightarrow 2e+A^+ \qquad \text{Equation (2)}$$

Excitation: The collision of an electron e against a gas A shifts an outermost shell electron of the gas A to a higher energy level.

$$e+A \rightarrow e+A^* \; (A^*\text{: Excited state of A}) \qquad \text{Equation (3)}$$

Dissociation: The collision of an electron e against a gas molecule AB dissociates the gas molecule AB into A and B.

$$e+AB \rightarrow e+A+B \qquad \text{Equation (4)}$$

Attachment: The collision of an electron e against a gas A bonds the electron e to the gas A to form an anion.

$$e+A \rightarrow A^- \qquad \text{Equation (5)}$$

Many researchers have studied these collision processes, and these studies have been important in the field of plasma. The energy of electrons in plasma normally has a large energy width, and the above-described collision processes occur complicatedly. Although this makes the estimation of reactions in plasma difficult, studies in this field has been dramatically advanced.

Figure 3:
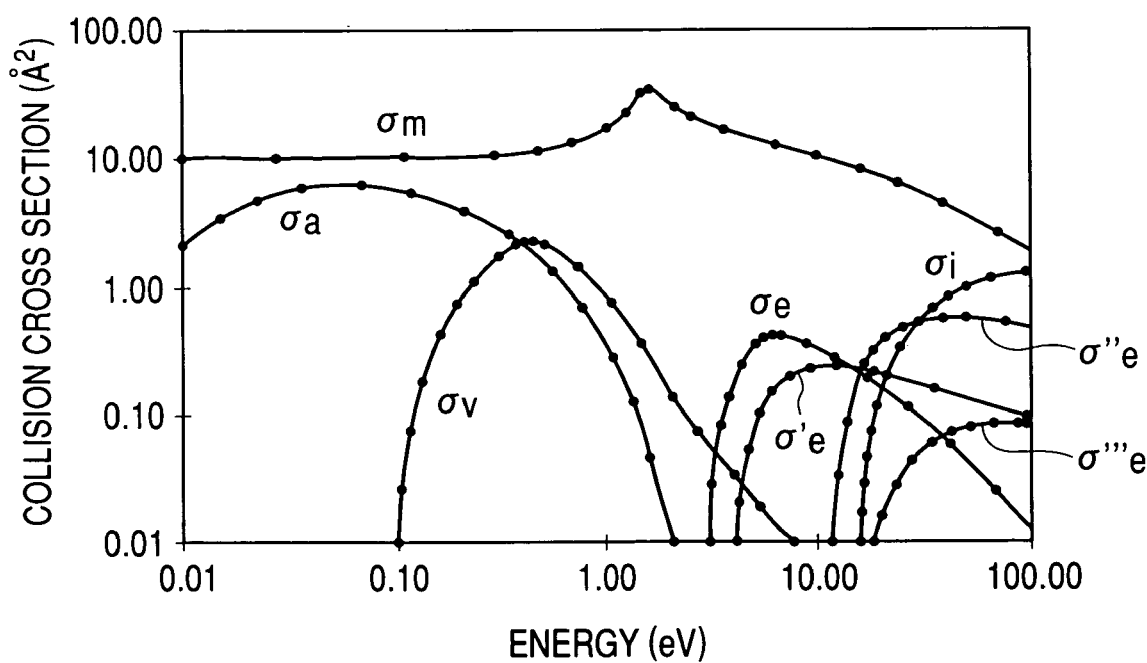
FIG. 3 is a graphical representation showing the electron collision cross sections of $F_2$ gas.

Among these collision processes, the electron attachment (5) normally forms an anion by collision of an electron against an electrically negative gas. Typical gases to cause such electron attachment include halogen molecules such as fluorine molecules and chlorine molecules, halogen-containing molecules such as sulfur hexafluoride ($SF_6$), tetrafluoromethane ($CF_4$) and hydrogen chloride (HCl), and silane ($SiH_4$). The collision cross sections of these collision processes are described, for example, in Morgan, Plasma Chemistry and Plasma Processing, Vol. 12, No. 4 (1992), pp. 449-476. Some of gas particles causing electron attachment will be dissociated soon because anions formed by electron attachment are unstable. Such a reaction is referred to as dissociative electron attachment. Taking the case of fluorine gas as an example of a gas causing dissociative electron attachment, the manner of radical formation will be described below. FIG. 3 shows the data of the collision cross section of fluorine gas ($F_2$) disclosed in Morgan above. FIG. 3 is a graph showing the energy of colliding electrons in electron volts (eV) on the abscissa, and the collision cross section, which represents the ease of occurring the above-described each collision process on the ordinate. In FIG. 3, $\sigma_m$ denotes elastic collision cross section, $\sigma_a$ denotes electron attachment cross section, $\sigma_e$, $\sigma'_e$, $\sigma''_e$ and $\sigma'''_e$ denote excitation cross sections of different excited states, $\sigma_i$ denotes ionization cross section, and $\sigma_v$ denotes vibration cross section not described above. All of the electron attachment of fluorine gas is dissociative electron attachment, and the reaction is represented by:

$$e+F_2 \rightarrow F+F^- \qquad \text{Equation (6)}$$

As is seen from FIG. 3, the $\sigma_a$ shows very large values having a peak at around 0.1 eV of the energy of colliding electrons. Thus, fluorine gas is characterized in that dissociative electron attachment occurs by collision with electrons having a lower energy compared with the excitation cross section and ionization cross section and has a greater cross section. Therefore, in the collision against an electron with an energy of 2 eV or less, dissociative electron attachment occurs in most cases except elastic collision, F radicals and F⁻ are major products, and the formation rate is also high due to the large cross section.

On the other hand, at an energy of 15.7 eV or more, since ionization occurs as shown by Equation (7), plasma will be generated.

$$e+F_2 \rightarrow 2e+F_2^+ \qquad \text{Equation (7)}$$

When plasma is generated, since various chemical reactions will occur in the plasma, cations such as $F_2^+$ and $F^+$, excited species such as F* wherein electrons are in an excited state, and anions such as F⁻ are present as a mixture, so that it becomes difficult to select specific radicals. Further, the energy required to form necessary radicals also becomes large.

As described above, in the case of collision of electrons having such an energy as to cause ionization (referred to as "ionization energy") against a gas, it is difficult and inefficient to selectively form desired radicals by plasma generation, and also a problem of damage to the fluoride thin film by plasma arises. However, by restrictively utilizing collision of electrons having an energy less than the ionization energy, necessary radicals can selectively be formed at a high energy efficiency and plasma generation in the vicinity of the substrate can be prevented, resulting in formation of a fluoride thin film with extremely little optical absorption.

As described above, according to the present invention, in the formation of a fluoride thin film, such as an $MgF_2$ film, by adopting a thin film forming method of forming a metal fluoride thin film on a substrate by performing reactive sputtering with a gas comprising fluorine by use of a metal target, which comprises irradiating a gas comprising fluorine with electrons having an energy less than the ionization energy of the gas comprising fluorine to activate the gas and introducing the activated gas into a reaction apace, thereby performing sputtering, a fluoride thin film with little absorption throughout a region ranging from the visible region to the ultraviolet region can stably be formed.

Two examples of the present invention will be described in detail below referring to the drawings. The flowing examples are given for the purpose of illustration and not by way of limitation. It will be apparent to one of ordinary skill in the art that many changes and modifications can be made thereto without departing from the spirit or scope of the invention as set forth herein.

Example 1

FIG. 1 is a schematic sectional view of a DC magnetron sputtering apparatus according to Example 1 of the present invention. As shown in FIG. 1, the sputtering apparatus is equipped with a vacuum vessel 1 that can maintain the inside in a substantially vacuum state. On the bottom center of the vacuum vessel 1, a cathode 2 that houses a magnet therein and can be cooled by water is provided. A backing plate 3 is placed on the upper surface of the cathode electrode 2, and a high-purity Mg metal target 4 is fixed on the upper surface of the packing plate 3. The material for the target may include various metals, and oxygen-added metals or fluorine-added metals can be used as long as the electrical resistance is low. An anode electrode 5 is fixed to the vacuum vessel 1 with a predetermined gap to the target 4. Incidentally, an insulator 6 is disposed between the anode electrode 5 and the backing plate 3.

On the upper surface of the vacuum vessel 1, an article to be processed 7 is movably mounted on a moving mechanism (not shown) between an article supporting structure 8 and a load-lock chamber 10 through a gate valve 9. A shutter 11 is provided between the article 7 and the target 4, so that a film is not deposited on the article 7 until discharge is stabilized. The shutter 11 can be opened and closed quickly by a moving mechanism (not shown). Sealing members for preventing leakage in the vacuum vessel 1, not denoted by reference numerals, are provided on adequate portions of the vacuum vessel 1.

The article 7 is mounted at a location that does not face the target 4, so as not to be directly affected by anions formed on the surface of the target 4 and accelerated by a target sheath.

Further, the sputtering apparatus is constituted such that Ar gas as a sputtering gas, and $F_2$ gas diluted with Ar to a concentration of 5% as a reactive gas are introduced from a sputtering gas introducing port 13 and a reactive gas introducing port 14 using a gas supply system having mass flow controllers. Here, the flow rate, purity and pressure of each of the gases to be introduced are accurately controlled, and can be maintained at constant levels. As required, as an inert gas to dilute. $F_2$ other than Ar, a gas such as He, Ne, Kr and Xe; and as a fluorine-containing gas other than $F_2$, a reactive gas such as $CF_4$, $NF_3$ and $SF_6$, can be introduced by switching.

The $F_2$ gas diluted with Ar to a concentration of 5% introduced through the reactive gas introducing port 14 forms F atoms in the radical generator 18, which are introduced in the vicinity of the substrate.

Figure 2:
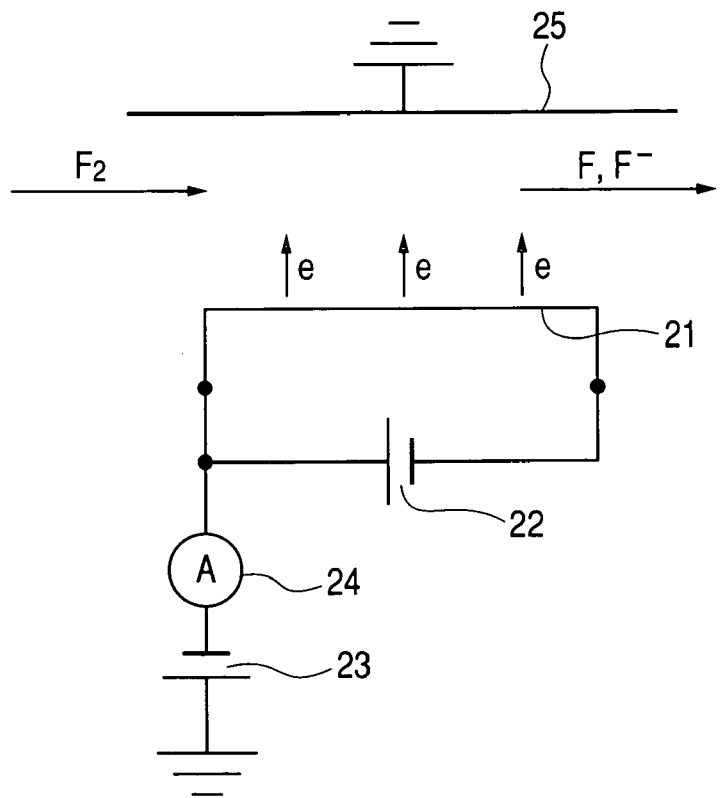
FIG. 2 is a schematic view showing a radical generator used in the apparatus for forming a fluoride thin film according to the present invention.

The radical generator will be outlined referring to FIG. 2. In FIG. 2, by applying a voltage of $V_e$ (V) to a heating power source 22, a filament 21 is subjected to conduction heating to emit thermal electrons. The emitted thermal electrons collide against $F_2$ gas to dissociate the $F_2$ gas thereby forming F atoms and F⁻ ions. At this time, a voltage of $V_a$ (V) may be applied to an accelerating power source 23 to optimize the energy of the electrons. In this Example, a tungsten (W) wire was used as the filament 21, and the output of the heating power source voltage was 0.5 V and the current at that time was about 30 A. With the accelerating power source, there was applied a voltage of 0.1 V of such a level as to be capable of confirming the formation of the thermal electrons by means of the current value of the ammeter 24. This was performed not to accelerate the electrons to above 1 eV, because the electron attachment dissociative cross section is rapidly decreased at above 1 eV as is seen form the electron collision cross section of $F_2$ gas shown in FIG. 3. Incidentally, in FIG. 2 reference numeral 25 denotes an earth electrode.

Next, a method of forming a magnesium fluoride thin film having a low absorption and a low refractive index on a quartz glass substrate using the apparatus shown in FIG. 1 will be described in detail below.

The vacuum vessel 1 was exhausted to a vacuum using an exhausting system 12. When the exhaust was completed to $1\times10^{-4}$ Pa, Ar gas was introduced through a sputtering gas introducing port 13 at 200 sccm. On the other hand, $F_2$/Ar gas was introduced at 200 sccm ($F_2$: 10 sccm) through a reactive gas introducing port 14 and passed through a radical generator 18 to be introduced into the vicinity of the substrate 7. When a DC power of 500 W was applied to the backing plate 3 from a DC power source 15, since the Ar gas was ionized through discharge, and since a magnetic field was formed above the target 4 by the magnet 17, electrons were trapped by the magnetic field to generate a magnetron plasma on the surface of the target 4. A sheath is formed by the discharge on the surface of the target, cations in the plasma are accelerated by the sheath to collide against the target 4 to emit sputtered Mg particles from the target 4.

In this Example, those conditions (gas pressure, flow rate, applied power) which cause no abnormal discharge are selected, the shutter disposed between the substrate and the target is closed until the discharge is stabilized, and is then opened when the discharge has been stabilized to form a thin film on the substrate (article) 7. When a film is formed under such conditions as to cause abnormal discharge, foreign matters are mixed in the film to provide the film with a large scattering property. The sputtered particles react with molecules containing active F atoms in the plasma and on the surface of the substrate to deposit a fluoride thin film on the substrate (article) 7. After the completion of the film formation, the shutter is closed and the discharge is stopped. After that, the substrate is carried out into atmosphere through the load-lock chamber 10. The spectral characteristics of an $MgF_2$ film deposited on the substrate (article) 7 are measured using a spectrophotometer, and the thickness, absorption and the like was calculated using the optical interference method.

When the filament in the radical generator 18 is not heated, the probability of the presence of $F_2$ molecules on the surface of the substrate is low, and the $F_2$ molecules are released again. Therefore, even if the flow rate of $F_2$ is increased, the proportion of F bonding to Mg atoms generally decreases, so that a film containing an insufficient quantity of F having a large absorption is liable to be formed.

Figure 5:
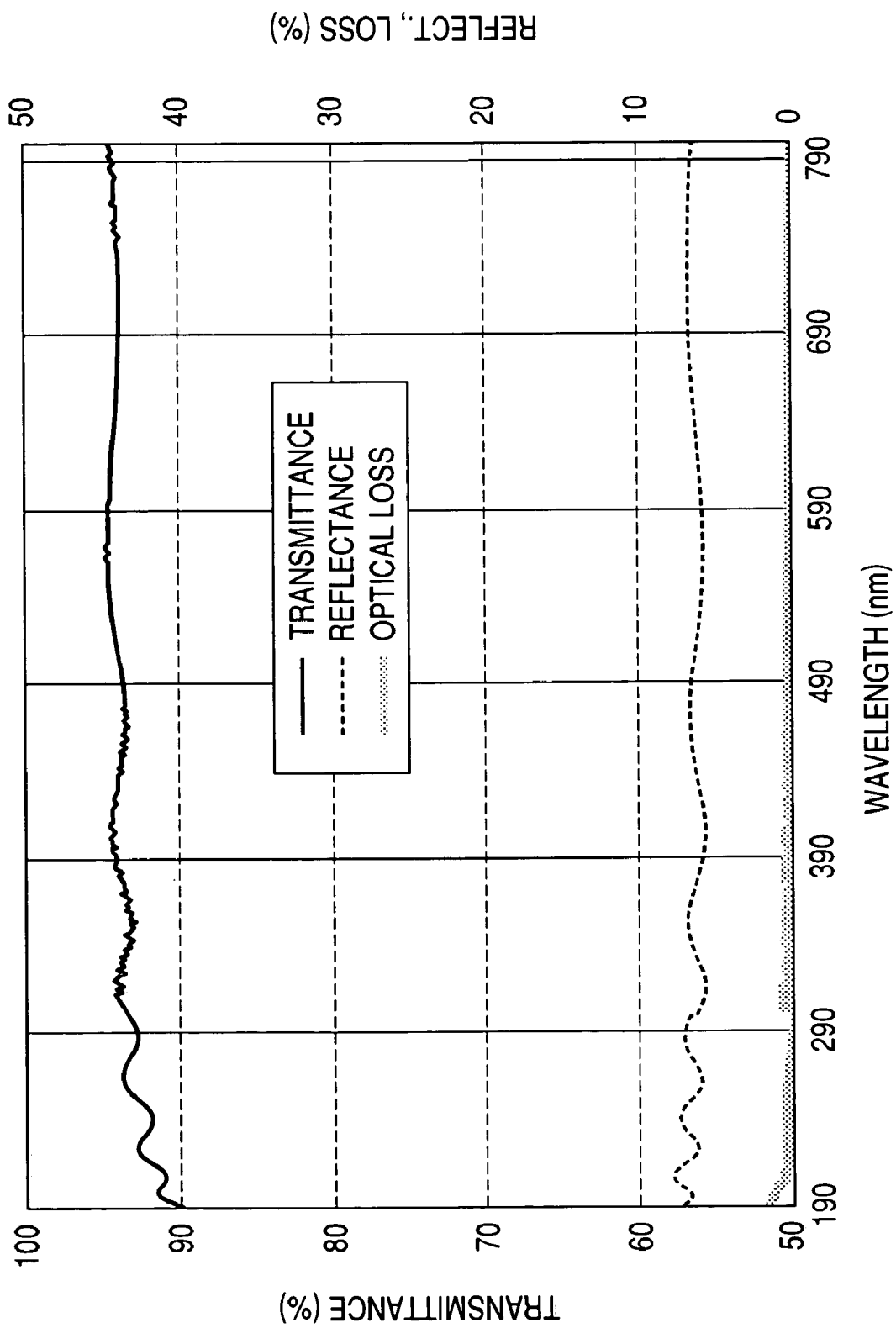
FIG. 5 is a graphical representation showing the optical characteristics of a sample prepared by forming an $MgF_2$ film on a quartz glass substrate.

When the filament in the radical generator 18 is heated, since almost 100% of F atoms react to be incorporated into the film, the thus obtained thin film has a low refractive index without absorption throughout a region ranging from the visible region to the ultraviolet region. FIG. 5 shows the optical characteristics of the sample of $MgF_2$ film formed on the quartz glass substrate. The film thickness calculated from the optical characteristics was 512 nm. Since the film formation time was 15 minutes, the film-forming rate was calculated to be 34.1 nm/s. The absorption of this $MgF_2$ thin film at the wavelength of 500 nm was 0.2% or less, and the refractive index was about 1.37.

Since in this Example a structure is adopted wherein anions formed on the surface of the target and accelerated by the target sheath do not directly impinge on the substrate, a fluoride thin film that is not damaged by anions can be formed. This is particularly advantageous when sputtering is performed at a low gas pressure. However, the damage due to anions can be suppressed to a level free from affection of anions by controlling the gas pressure and the applied power during sputtering, and even if the article is located so as to face the target surface, a fluoride thin film of a low absorption can be formed by optimizing the conditions.

Example 2

In this Example, a fluoride thin film was formed on a substrate by following the same procedure as in Example 1 with the exception that an La metal target was used in place of the Mg metal target and $SF_6$ gas was used in place of $F_2$ gas.

Figure 4:
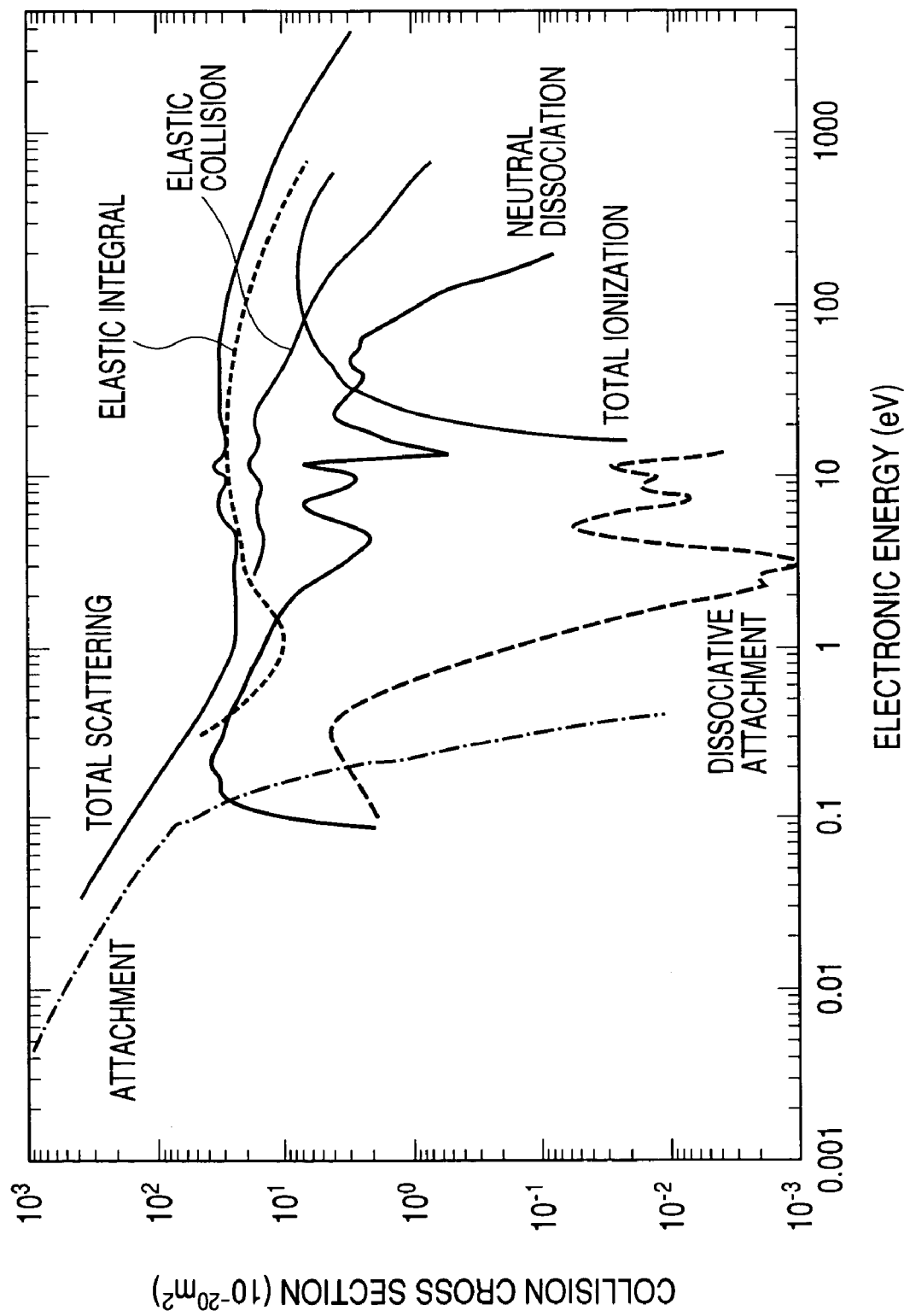
FIG. 4 is a graphical representation showing the electron collision cross sections of $SF_6$ gas.

FIG. 4 shows a graph of the electron collision cross section of $SF_6$ gas. As is seen from the graph of FIG. 4, also in the case of $SF_6$ gas, although the dissociative electron attachment cross section is large when the electron energy is 1 eV or less, there is a peak of the dissociative electron attachment cross section at around 5 eV. Therefore, in this Example, 5 V was applied to the accelerating power source so as to accelerate thermal electrons emitted from the filament in the radical generator to 5 eV. By elevating the accelerating voltage, the current of the thermal electrons could be increased, thereby generating a sufficient quantity of active fluorine.

The obtained $LaF_3$ thin film exhibited no absorption throughout a region ranging from the visible region to the ultraviolet region. The $LaF_3$ thin film had a thickness of 250 nm and showed an absorption of 0.2% or less at a wavelength of 500 nm and a refractive index of about 1.506.

As shown in Examples 1 and 2, the $MgF_2$ and $LaF_3$ thin films exhibiting a low absorption throughout a region ranging from the visible region to the ultraviolet region were obtained. Further, a similar thin film of a low absorption was also obtained for each of $AlF_3$ and LiF. Moreover, thin films exhibiting a low absorption throughout a region ranging from the visible region to the ultraviolet region were obtained for other metal fluorides.

What is claimed is:

1. A thin film forming method of forming a metal fluoride thin film on a substrate by performing reactive sputtering, which comprises sputtering a metal target with a first gas, and irradiating a second gas comprising fluorine with free electrons having a kinetic energy in electron volts less than the an ionization energy of the second gas to activate the second gas without generating a plasma, and thereafter, introducing the activated second gas into a space in the vicinity of the substrate.

2. The thin film forming method according to claim 1, wherein the free electrons used for the irradiation are thermal electrons emitted from a filament.

3. The thin film forming method according to claim 2, wherein the filament is heated by applying a voltage such that the energy given by the applied voltage is less than the ionization energy of the second gas.

4. The thin film forming method according to claim 2, wherein the thermal electrons emitted from the filament are accelerated such that the energy given by the sum of the voltage applied for heating the filament and the voltage applied for accelerating the thermal electrons emitted from the filament is less than the ionization energy of the second gas.

5. The thin film forming method according to claim 1, wherein the second gas comprising fluorine is either $F_2$ or $SF_6$ gas.

6. The thin film forming method according to claim 1, wherein a rare gas as a sputtering gas is introduced into the vicinity of the metal target while the second gas comprising fluorine is activated and, thereafter, introduced into the vicinity of the substrate.

7. A thin film forming apparatus for forming a metal fluoride thin film on a substrate by performing reactive sputtering with a gas comprising fluorine by use of a metal target, which comprises:

a first gas supply means for introducing a sputtering gas into the vicinity of the metal target, a second gas supply means for introducing a gas comprising fluorine into the vicinity of the substrate, and an electron source for irradiating the gas comprising fluorine with free electrons having a kinetic energy less than the an ionization energy of the gas comprising fluorine to activate the gas comprising fluorine without generating a plasma.

8. The thin film forming apparatus according to claim 7, wherein the electron source is a filament for emitting thermal electrons.

* * * * *